(12) United States Patent
Walker et al.

(10) Patent No.: US 6,279,071 B1
(45) Date of Patent: Aug. 21, 2001

(54) SYSTEM AND METHOD FOR COLUMN ACCESS IN RANDOM ACCESS MEMORIES

(75) Inventors: Robert M. Walker, Rougemont, NC (US); Tim Lao, San Jose, CA (US); Stephen Camacho, Durham, NC (US)

(73) Assignee: Mitsubishi Electric and Electronics USA, Inc., Durham, NC (US)

( * ) Notice: Subject to any disclaimer, the term of this patent is extended or adjusted under 35 U.S.C. 154(b) by 0 days.

(21) Appl. No.: 09/111,277

(22) Filed: Jul. 7, 1998

(51) Int. Cl.[7] ............................. G06F 12/00; G11C 7/10; G11C 8/06
(52) U.S. Cl. ............... 711/104; 365/189.05; 365/230.06; 365/230.08
(58) Field of Search .................. 365/189.05, 230.06, 365/230.08, 236, 239, 230.03; 711/217, 218, 219, 104, 105

(56) References Cited

U.S. PATENT DOCUMENTS

| | | | |
|---|---|---|---|
| Re. 36,089 | * 2/1999 | Ooishi et al. | 365/189.01 |
| Re. 36,655 | * 4/2000 | Kozaru et al. | 365/189.05 |
| 4,130,900 | 12/1978 | Watanabe | 365/230 |
| 4,520,465 | 5/1985 | Sood | 365/203 |
| 4,953,127 | 8/1990 | Nagahashi et al. | 365/189.05 |
| 5,265,050 | 11/1993 | McLaury | 365/189.01 |
| 5,293,347 | 3/1994 | Ogawa | 365/230.01 |
| 5,341,341 | 8/1994 | Fukuzo | 365/233 |
| 5,349,565 | 9/1994 | Wu et al. | 365/230.08 |
| 5,357,474 | 10/1994 | Matano et al. | 365/203 |
| 5,416,743 | 5/1995 | Allan et al. | 365/203 |
| 5,426,606 | 6/1995 | Takai | 365/189.05 |
| 5,477,484 | 12/1995 | Nakashima | 365/182 |
| 5,488,580 | 1/1996 | Park | 365/189.05 |
| 5,539,696 | 7/1996 | Patel | 365/189 |
| 5,544,124 | 8/1996 | Zagar et al. | 365/230.08 |
| 5,575,463 | 11/1996 | Akaogi et al. | 365/185.01 |
| 5,748,553 | * 5/1998 | Kitamura | 365/230.03 |
| 5,777,943 | * 7/1998 | Kim et al. | 365/230.06 |
| 5,805,523 | * 9/1998 | Lysinger | 365/230.08 |
| 6,055,194 | * 4/2000 | Seo et al. | 365/194 |

* cited by examiner

Primary Examiner—Do Hyun Yoo
Assistant Examiner—Gary J. Portka
(74) Attorney, Agent, or Firm—Burns, Doane, Swecker & Mathis, L.L.P.

(57) ABSTRACT

A column access system is provided with a column counter for producing a column address in response to an external address. The column address is latched in an address decoder which decodes the column address to select a column in the DRAM. A command decoder generates a column decode enable signal supplied to the address decoder to control latching of the column address, and a write enable signal, together with data, supplied to a write driver. A data latch is provided in the write driver for latching data until an equalize control signal is activated. The latched data signal drives global input/output pair to provide data writing to the DRAM.

11 Claims, 7 Drawing Sheets

SYSTEM AND METHOD FOR COLUMN ACCESS IN RANDOM ACCESS MEMORIES

FIELD OF THE INVENTION

This application relates to memory devices, and in particular, to a method of providing accelerated column access to a random access memory (RAM).

BACKGROUND ART

Reference is now made to FIG. 1 that shows a conventional system 10 for providing column access to a RAM, and FIG. 2 that illustrates typical waveforms for a write operation. The column access system 10 comprises a column counter 12 that receives an external n-bit address signal ExtAdd<0:n> to produce a column address CA<0:n>. An external command ExtCmd defining a RAM operation is supplied to a command decoder 14 that decodes the command and produces signals required to execute it. For example, if the ExtCmd defines a write operation, the command decoder 14 produces a write enable signal WE, a global input/output equalize control signal GIOEQ, and a column decode enable signal CDE.

An address decoder 16 receives the column address CA<0:n>, together with the column decode enable signal CDE, to produce a decoded column address AYD supplied to a column select line (CSL) generator 18. The write enable signal WE and the equalize control signal GIOEQ, together with data ZWDD, are supplied to a write driver 20 for producing a global input/output signal GIO and a complementary global input/output signal ZGIO to drive a global input/output pair GIO/ZGIO coupled to a DRAM array 22. The global input/output pair GIO/ZGIO is used for providing data transfer during writing and reading operations. A column select line signal CSL<0:n> produced by the CSL generator 18 selects a column in the DRAM array 22 for writing the data As shown in FIG. 2, a new column address CA is generated and latched in the column counter 12 at the rising edge of a clock signal CLK during a write cycle. Such latching allows the column address to be isolated from the external address ExtAdd. Thus, the external address ExtAdd can be changed without changing the generated column address CA. The write enable signal WE is activated after the column address CA is initiated.

As a result, a new CSL signal based on the new column address CA cannot be produced until the current write or read operation is completed. For example, when a precharge command is issued during a write operation, a precharge operation is delayed by the write recovery time tWR equal to the time period between the raising edge of the clock corresponding to the write operation and the raising edge of the CSL signal.

The write recovery time tWR may be greater than 1 clock cycle. In this case, a no operation command NOP must be issued between the write operation and the precharge operation.

Accordingly, it would be desirable to provide a column access system that allows the write recovery time to be reduced to eliminate a no operation cycle between a write operation and the next operation, such as a precharge operation.

Further, in the conventional column access system, the GIO/ZGIO pair is driven only when the write enable signal WE and other write control signals, such as the column decode enable signal CDE, are at a high level. Therefore, the signals WE and CDE has to be latched in the command decoder 14 to maintain them at a high level as long as a write operation occurs. Thus, in high-frequency applications, when the clock cycles are short, the write enable signal WE and the column decode enable signal CDE cannot be reset until the next clock cycle begins. As a result, the next operation is delayed.

It would be desirable to provide a column access system that allows the write control signals to be reset in the current clock cycle to reduce a delay between operations.

DISCLOSURE OF THE INVENTION

Accordingly, one advantage of the invention is in providing a column access system that allows the time recovery time to be reduced to decrease a delay between memory operations.

Another advantage of the invention is in providing a column access system that allows write control signals to be reset in a current clock cycle to further reduce a delay between memory operations.

These and other advantages of the present invention are achieved, at least in part by providing a random access memory that comprises a column counter responsive to an external address for producing a column address. In response to an external command, a command decoder produces a column decode enable signal. An address decoder is responsive to the column address and column decode enable signal for producing a decoded column address signal used to select a column line. The address decoder has a column address latch that latches the column address to produce the decoded column address signal independently of changes in the column address supplied to the address decoder.

The address decoder may further comprise a gate circuit controlled by the column decode enable signal for passing the column address signal to the column address latch when the column decode enable signal is in an active state. The column address latch is cleared when an equalize control signal goes to an active state.

The memory may further comprise a write driver supplied with an input data signal representing data to be written in a selected memory cell. The command decoder may produce a write enable signal supplied to the write driver.

In accordance with a first embodiment of the invention, the write driver may comprise a first data latch controlled by the write enable signal for latching the input data signal. A second data latch is coupled to the first data latch for latching a first data signal supplied from the first data latch. A gate circuit is arranged between the first and second data latches for passing the first data signal to the second data latch when the write enable signal is in a first state, and for preventing the data signal from being supplied to the second data latch when the write enable signal is in a second state. The second data latch is responsive to the first data signal to produce a second data signal for driving a data output circuit of the write driver. The second data latch is cleared when the equalize control signal goes to an active state.

In accordance with a second embodiment of the invention, the write driver may comprise a write enable latch supplied with the write enable signal for producing a local write enable signal maintained at a first level until the equalize control signal goes to an active state. The local write enable signal controls a data latch for latching the input data signal. The data output circuit is driven by a data signal produced by the data latch.

In accordance with another aspect of the invention, a system for providing access to a column of a random access memory comprises:

a column counter responsive to an external address for producing a column address in a clock cycle, in which the external address is supplied, and an address decoder responsive to the column address for producing a decoded column address signal and having a column address latch for latching the column address until an equalize control signal becomes active.

In accordance with a method of the present invention the following steps are carried out to provide access to a column of a RAM:

in response to an external address, generating a column address in a clock cycle, in which the external address is supplied, and latching the column address until an equalize control signal becomes active.

In accordance with one embodiment of the invention, a data signal may be latched until the equalize control signal becomes active.

In accordance with another embodiment of the invention, a write enable signal may be latched until the equalize control signal becomes active.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 3:
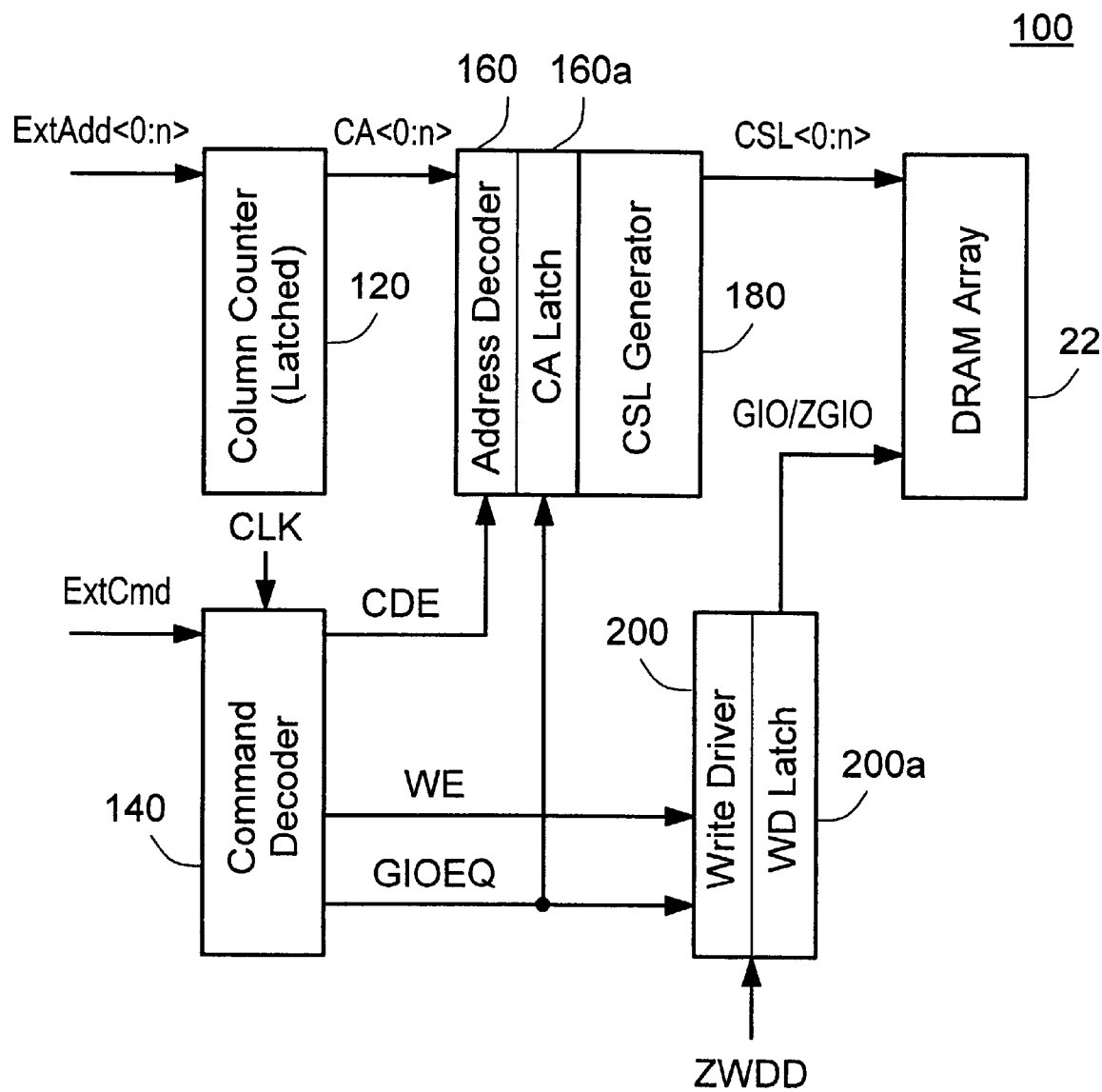
FIG. 3 is a block diagram of a column access system of the present invention.

Although the invention has general applicability in the field of memory devices, the best mode for practicing the invention is based in part on the realization of a column access system for writing data to a DRAM array. Reference is now made to FIG. 3 that shows a column access system 100 of the present invention, and FIG. 4 that illustrates waveforms for write operations in the system 100. A column counter 120 receives an n-bit external address ExtAdd<0:n> to generate a column address CA<0:n>.

Figure 1:
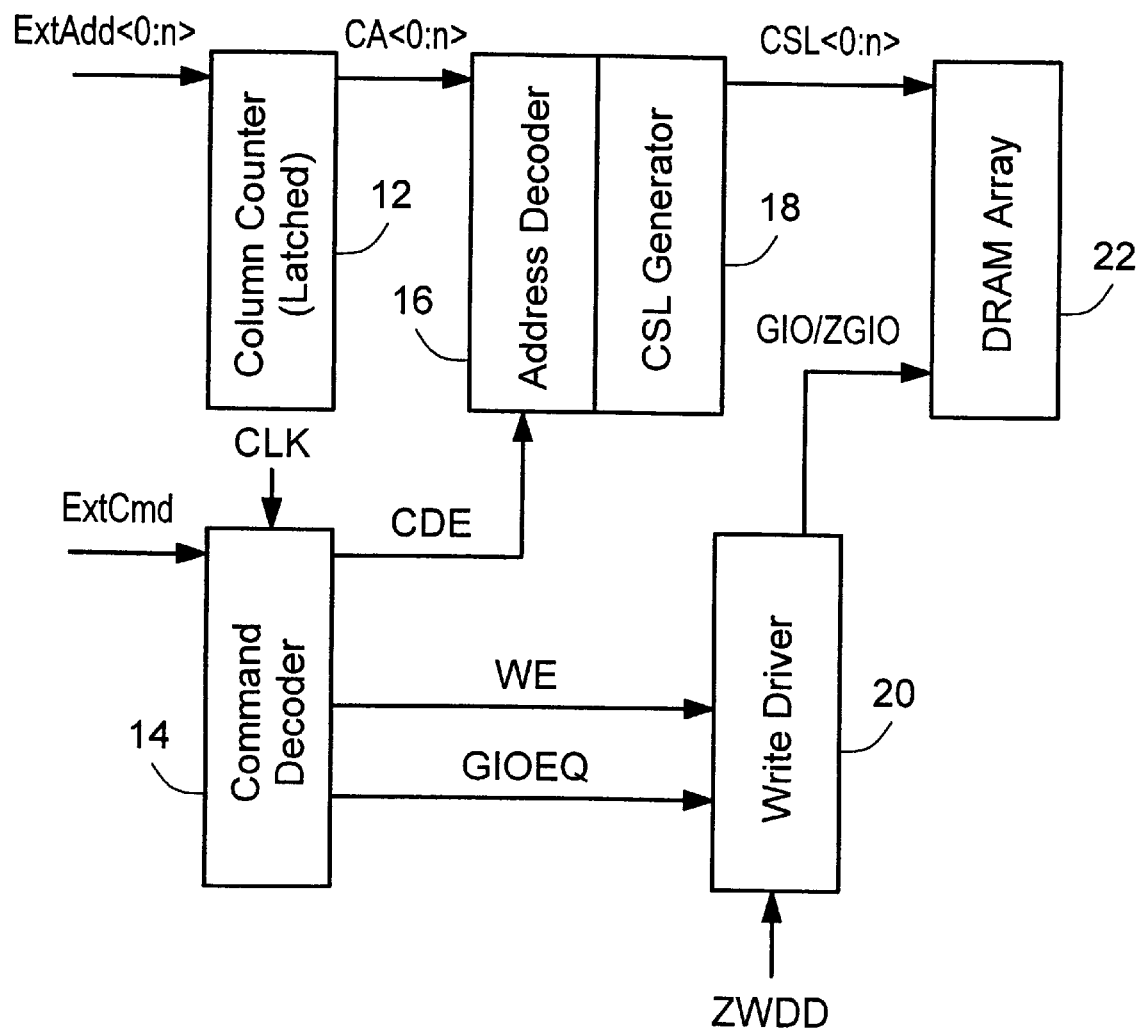
FIG. 1 is a block diagram of a conventional system for providing access to a column of a DRAM array.
Figure 2:
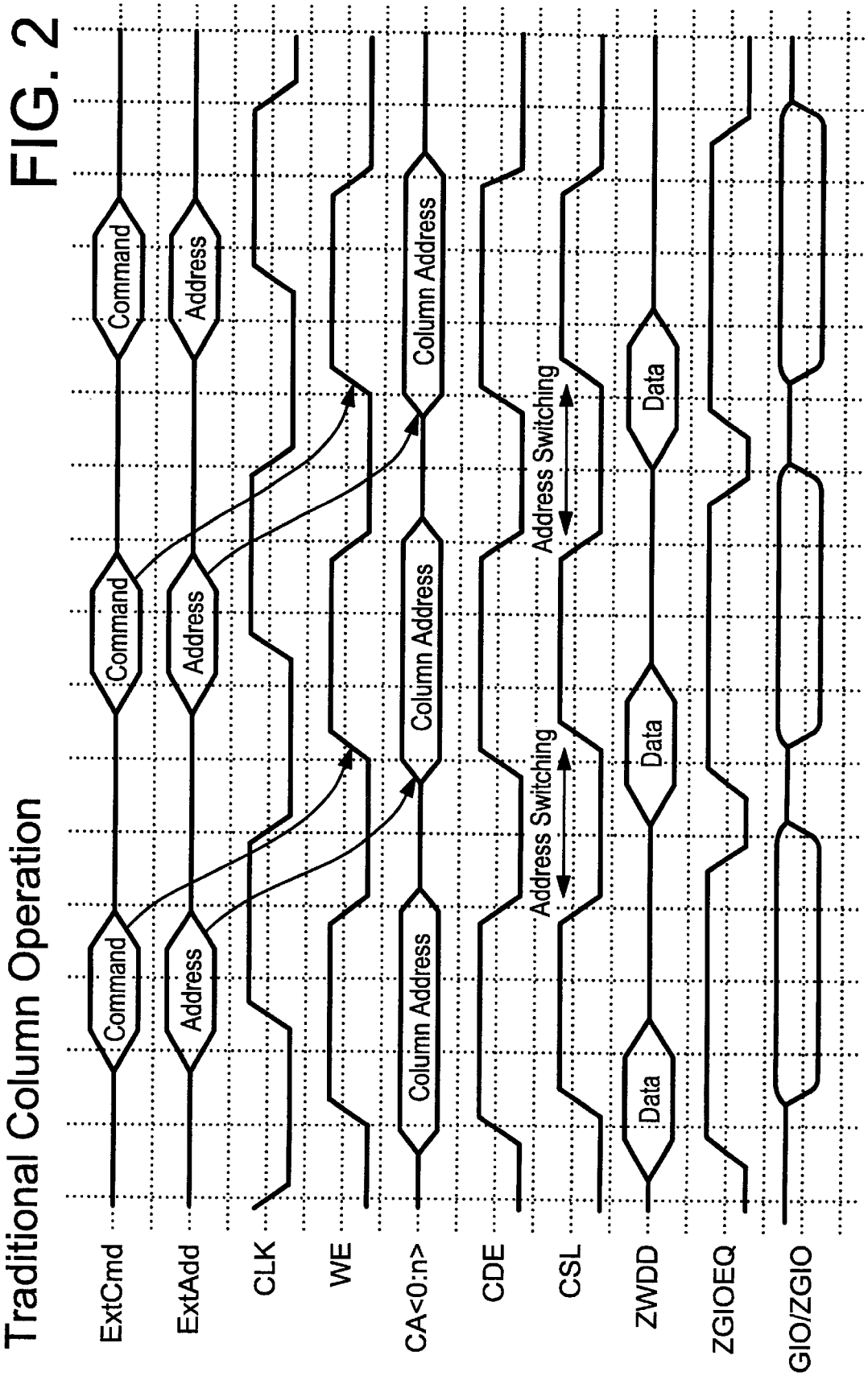
FIG. 2 is a timing diagram illustrating typical waveforms for write operations.
Figure 4:
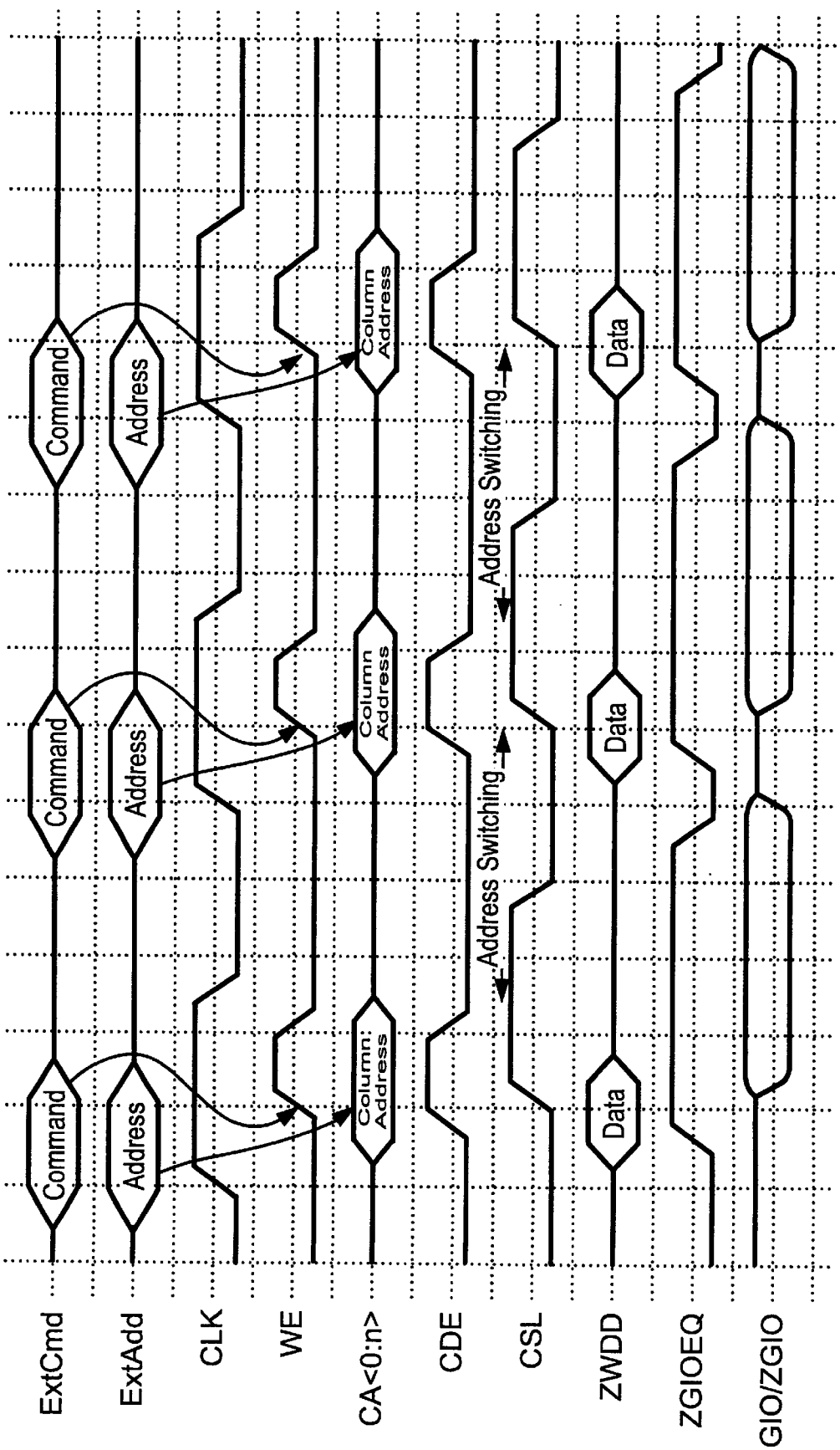
FIG. 4 is a timing diagram illustrating waveforms for write operations in accordance with the present invention.

By contrast with the column address counter 12 shown in FIG. 1, the column counter 120 does not contain a latch for latching an external address ExtAdd<0:n> at the rising edge of a clock signal CLK to isolate the column address CA<0:n> from the external address ExtAdd<0:n>. Therefore, as shown in FIG. 4, the column address CA<0:n> may be produced immediately after supplying the external address signal ExtAdd<0:n>.

A command decoder 140 receives an external command ExtCmd defining a memory operation to be performed. For example, if the command ExtCmd requires a write operation to be carried out, the command decoder 140 produces a write enable signal WE, a global input/output equalize control signal GIOEQ, and a column decode enable signal CDE. The command decoder 140 is supplied with a clock signal CLK to synchronize the generation of the control signals. However, by contrast with the command decoder 14 shown in FIG. 1, the command decoder 140 produces short control signals WE and CDE because the present invention does not require these signals to be at a high level as long as a write operation is carried out.

An address decoder 160 receives the column address CA<0:n>, together with the column decode enable signal CDE, to produce a decoded column address AYD. As discussed in more details below, the address decoder 160 contains a column address (CA) latch 160a for latching the column address CA<0:n> to prevent the decoded column address AYD from being modified when the column address CA<0:n> changes. The decoded column address AYD is supplied to a column select line (CSL) generator 180 to produce a column select line signal CSL<0:n>.

The write enable signal WE and the equalize control signal GIOEQ, together with an inverted data signal ZWDD, are supplied to a write driver 200 for producing a global input/output signal GIO and a complementary global input/output signal ZGIO to drive a global input/output pair GIO/ZGIO. As discussed in more detail later, the write driver 200 contains a write driver (WD) latching circuit 200a for latching the data ZWDD. When the write enable signal WE goes high, the WD latching circuit 200a latches the data ZWDD until the equalize control signal GIOEQ goes high. In alternative embodiment of the present invention discussed in more detail below, the write driver 200 contains a latching circuit that latches the write enable signal WE until the equalize control signal GIOEQ goes high. It is noted that the timing diagrams in FIG. 4 illustrate a complementary equalize control signal ZGIOEQ inverted with respect to the equalize control signal GIOEQ.

A data signal latched in the write driver 200 drives the global input/output pair GIO/ZGIO to write data to the DRAM array 22. The column select line signal CSL<0:n> produced by the CSL generator 180 selects a column in the DRAM array 22 for writing the data.

When the equalize control signal GIOEQ goes high, the potentials on the global input/output pair GIO/ZGIO is equalized Also, a high level of the equalize control signal GIOEQ clears the WD latch 200a.

As the external address ExtAdd<0:n> is not latched in the counter, the column counter 120 initiates counting to produce the column address CA<0:n> as soon as the external address ExtAdd is supplied. Thus, as illustrated in FIG. 4, the generation of the column address CA <0:n> for performing a memory operation in the next clock cycle is completed on the negative edge of the clock CLK in the current cycle in which the external address ExtAdd is provided.

Further, as the write driver 200 performs latching of data ZWDD, there is no need to maintain the write control signals WE and CDE in an active state during the entire write operation. Thus, the command decoder 140 is able to reset write enable signal WE and column decode signal CDE for the current write operation in the current clock cycle to allow the next operation to be performed in the next clock cycle.

As a result, the delay between the instant in which the external address ExtAdd is supplied and the instant in which the column select line signal CSL is produced is substantially reduced. Thus, the column access system of the present invention allows column access to be performed substantially faster than in a conventional column access system.

Figure 5:
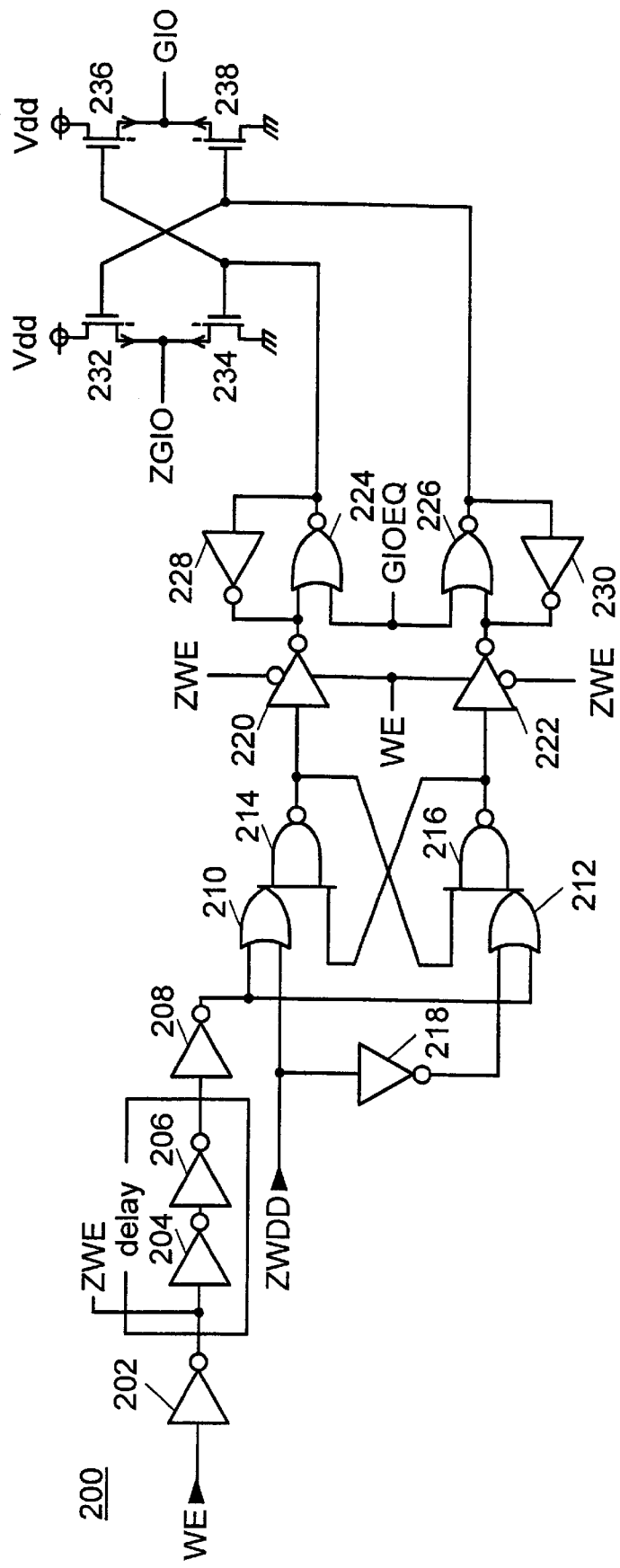
FIG. 5 is a circuit diagram of a write driver in accordance with a first embodiment of the invention.

Referring to FIG. 5, a first preferred embodiment of the write driver 200 according to the present invention comprises an inverter 202 for receiving a write enable signal WE supplied from the command decoder 140. Inverters 204 and 206 coupled to the inverter 202 form a delay circuit for delaying the inverted write enable signal ZWE produced at the output of the inverter 202.

Via an inverter 208, the delayed write enable signal is supplied to a preliminary data latch formed by OR gates 210 and 212, and cross-coupled NAND gates 214 and 216. The output of the inverter 208 is connected to first inputs of the OR gates 210 and 212. The inverted data signal ZWDD is supplied to a second input of the OR gate 210. Via an inverter 218, the data signal ZWDD is provided to a second input of the OR gate 212.

The outputs of the OR gates 210 and 212 are connected to first inputs of NAND gates 214 and 216. A second input of the NAND gate 214 is coupled to the output of the NAND gate 216, whereas a second input of the NAND gate 216 is connected to the output of the NAND gate 214.

Clock inverters 220 and 222 are connected to the outputs of the preliminary data latch to control propagation of the output signals of the preliminary data latch to a main data latch formed by NOR gates 224 and 226, and inverters 228 and 230. The clock inverters 220 and 222 may be controlled inverting gates having first control inputs supplied with the inverted write enable signal ZWE. Second control inputs of the gates are provided with the write enable signal WE. The inverting gates 220 and 222 are open when the write enable signal WE is at a high level.

The outputs of the gates 220 and 222 are connected to first inputs of the NOR gates 224 and 226, respectively. The second inputs of the NOR gates 224 and 226 are provided with the global input/output equalize control signal GIOEQ from the command decoder 140. The inverter 228 is arranged in a feedback loop between the output and the first input of the NOR gate 224, whereas the inverter 230 provides feedback between the output and the first input of the NOR gate 226.

The output signals of the main data latch are supplied to an output write driver formed of two cross-coupled pairs of MOSFET transistors 232, 234 and 236, 238. Transistors in each pair are connected between a voltage source Vdd and a ground terminal. The output of the NOR gate 224 is connected to gates of the transistors 234 and 236, whereas the output of the NOR gate 226 is coupled to gates of the transistors 232 and 238. The global input/output signal GIO is produced at an output node between the transistors 236 and 238. The complementary global input/output signal ZGIO is generated at an output node between the transistors 232 and 234.

As shown in FIG. 4, data represented by the ZWDD signal become valid before the write enable signal WE goes high. Thus, after the data signal ZWDD propagates into the preliminary data latch, the WE signal is asserted. As soon as the write enable signal WE becomes high, the data ZWDD locked in the latch become isolated from an input data signal. Thus, the outputs of the NAND gates 214 and 216 will remain unchanged when the data signal ZWDD supplied to the latch changes.

Further, when the write enable signal WE is at a high level, the gates 220 and 222 are open to allow the output signal of the preliminary data latch to propagate into the main data latch. When the WE signal goes low, the gates 220 and 222 are closed to isolate the content of the main data latch from the preliminary data latch. Therefore, the data signal latched in the main data latch drives the output write driver independently of the content of the preliminary data latch. Thus, the global input output pair GIO/ZGIO coupled to the DRAM array is driven independently of input data changes.

For example, when the inverted data signal ZWDD is represented by logic 1, the NAND gate 214 produces logic 0. When the WE signal goes high, logic 0 will be latched at the output of the NAND gate 214. Also, the inverting gate 220 will be open to allow the inverted output value of the NAND gate 214 to propagate to the main data latch. Thus, logic 1 will be supplied to the input of the NOR gate 224 to produce logic 0 at its output.

Simultaneously, logic 1 will be latched at the output of the NAND gate 216. The inverting gate 222 open by a high level of the WE signal allows the inverted output value of the NAND gate 216 to propagate to the input of the NOR gate 226. Thus, logic 1 will be produced at the output of the NOR gate 226.

The output signal of the NOR gate 226 will control the gate of the transistor 228 of the output write driver to drive the GIO signal to a low level. Also, logic 1 from the output of the NOR gate 226 will control the gate of the transistor 232 to drive the ZGIO signal to a level of the voltage source Vdd. As a result, logic 0 is written to the selected cell of the DRAM array 22. Data represented by logic 1 may be written to the DRAM array 22 in a similar manner.

The data signal is latched in the main data latch until the global input/output equalize control signal GIOEQ goes high. When the GIOEQ signal provided to inputs of the NOR gates 224 and 226 goes high, the gates of the transistors 232, 234, 236 and 238 are supplied with a low level to equalize potentials at the GIO/ZGIO pair.

Thus, the arrangement of the write driver 200 does not require the write enable signal WE to be maintained at a high level during the entire write operation. Therefore, the WE signal may be reset in the current clock cycle to allow the next memory access operation to be performed in the next clock cycle.

Figure 6:
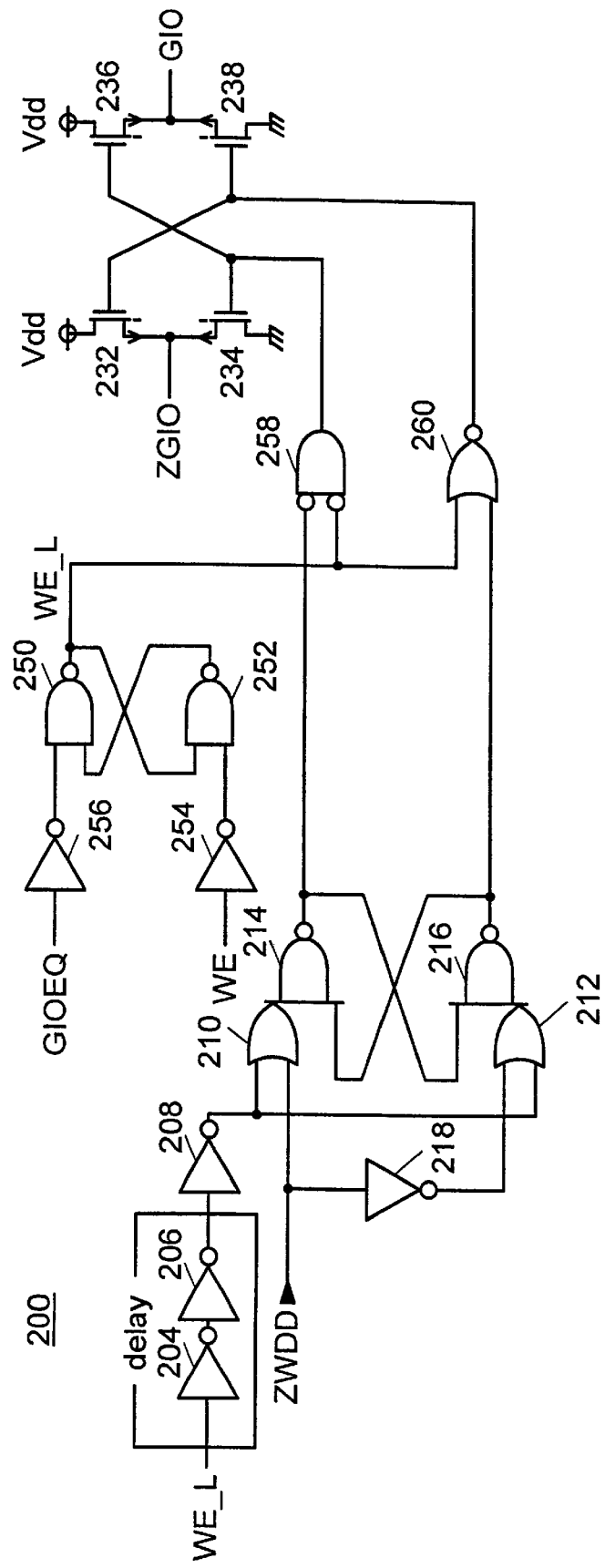
FIG. 6 is a circuit diagram of a write driver in accordance with a second embodiment of the invention.

FIG. 6 illustrates another preferred embodiment of the write driver according to the present invention. A write driver 200' shown in FIG. 6 comprises inverters 204 and 206 forming a delay circuit similar to the delay circuit in FIG. 5. OR gates 210 and 212, and NAND gates 214 and 216 are arranged in a data latch similar to the preliminary data latch in FIG. 5.

By contrast with the embodiment in FIG. 5, the data latch is controlled by a local write enable signal WE_L produced by a write enable latch formed by cross-coupled NAND gates 250 and 252. Via an inverter 254, the write enable signal WE is supplied from the command decoder 140 to a first input of the NAND gate 252. The global input/output equalize control signal GIOEQ produced by the command decoder is supplied via an inverter 256 to a first input of the NAND gate 250. A second input of the NAND gate 250 is connected to the output of the NAND gate 252, whereas a second input of the NAND gate 252 is coupled to the output of the NAND gate 250.

The local write enable signal WE_L produced at the output of the NAND gate 250 is supplied to the delay circuit formed by the inverters 204 and 206. Also, the local write enable signal WE_L controls gate circuits 258 and 260 that pass data to an output write driver. The gate circuit 258 may be an AND gate with inverting inputs, and the gate circuit 260 may be a NOR gate.

The output write driver is formed by transistor pairs 232, 234 and 236 and 238 have a similar arrangement as the output write driver shown in FIG. 5. The output write driver produces the GIO and ZGIO signals for driving GIO/ZGIO pair coupled to the DRAM array 22.

When the write enable signal WE goes high, a high level is latched at the output of the NAND gate 250. Thus, the local write enable signal WE_L is maintained at a low level, even when the write enable signal WE is reset.

The inverted data signal ZWDD is latched in the data latch to allow the data signal driving the GIO/ZGIO pair to be independent of changes in the input data signal. When the local write enable signal WE_L is at a low level, the gate circuits 258 and 260 are enabled to pass the data signal latched in the data latch to the output write driver. As a result, the GIO/ZGIO pair is driven to write data to the DRAM 22.

When the global input/output equalize control signal GIOEQ goes high, the local write enable signal WE_L goes high, and the output write driver is controlled to equalize potentials at the GIO/ZGIO pair.

Thus, the write enable latch maintains the local write enable signal WE_L at a low level during the entire write operation. However, the write enable signal WE may be reset in the current clock cycle to allow the next memory access operation to be carried out in the next clock cycle.

Figure 7:
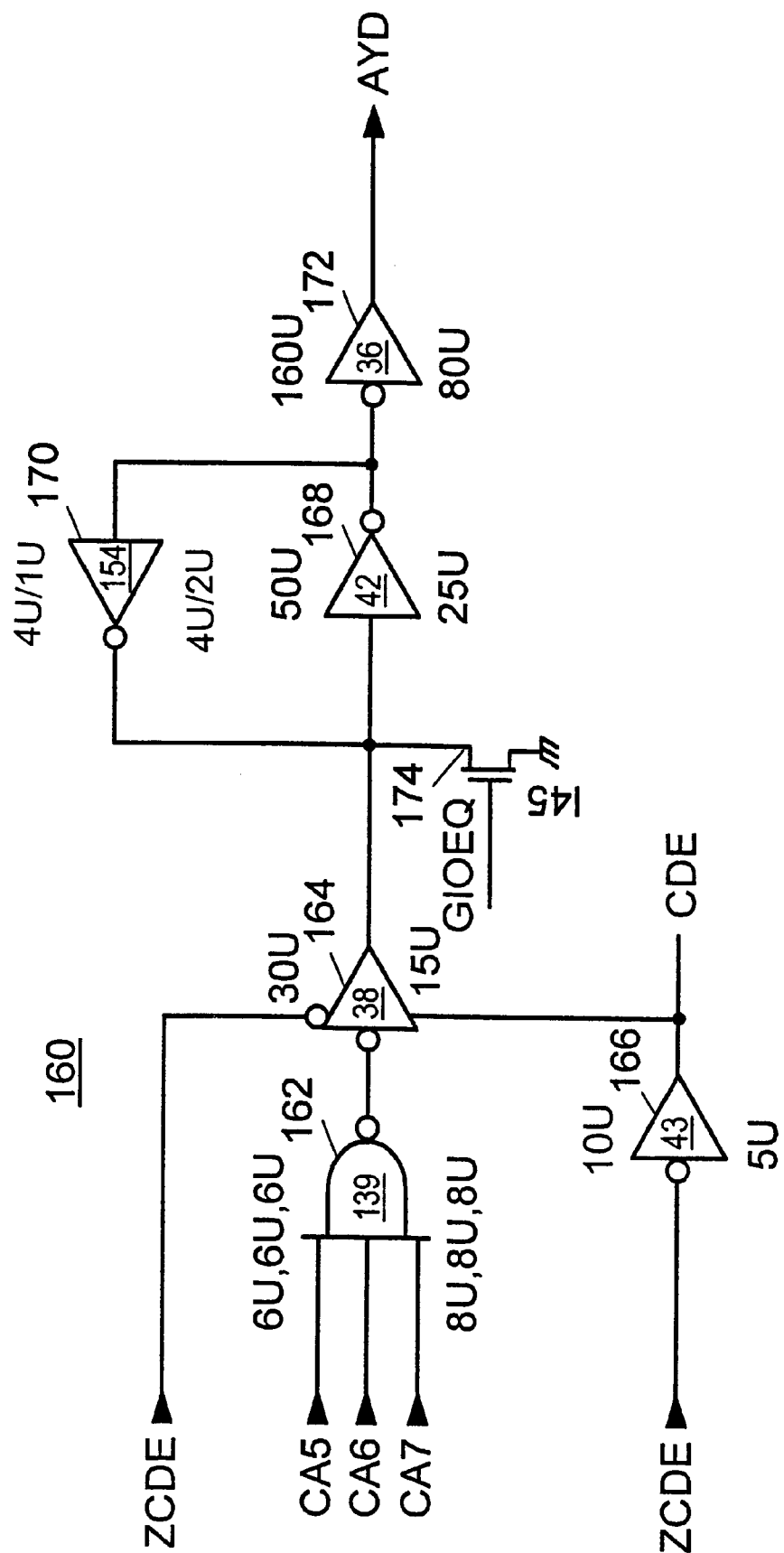
FIG. 7 is a circuit diagram of an address decoder of the present invention.

Reference is now made to FIG. 7 showing the address decoder 160 of the present invention that decodes the n-bit column address CA<0:n> supplied from the column counter 120. The address decoder 160 comprises a NAND gate 162 having multiple inputs for receiving corresponding bits of the column address CA<0:n>. For example, FIG. 7 shows three inputs of the NAND gate 162 for receiving bits 5, 6 and 7 of the column address CA.

The output of the NAND gate 162 is coupled to an inverting input of a clock converter 164, which may be an inverting gate circuit controlled by the column decode enable signal CDE and the inverted column decode enable signal ZCDE. As shown in FIG. 7, the ZCDE signal may be supplied to the address decoder 160. In this case, an inverter 166 is used to produce the column decode enable signal CDE.

When the column decode enable signal CDE is at a high level, the gate circuit 164 is open to allow the column address signal produced at the output of the NAND gate 162 to pass to a column address latch formed by inverters 168 and 170. An output inverter 170 is connected to the column address latch to produce a decoded column address AYD supplied to column select line generator 180.

A MOSFET transistor 174 is coupled between the input of the column address latch and a ground terminal. The global input/output equalize control signal GIOEQ is supplied to the gate of the transistor 174.

Thus, the CDE signal controls latching of the column address signal in the column address latch to isolate the decoded column address AYD from the column address CA<0:n>. The column address latch is cleared when the GIOEQ signal goes high.

As the address decoder 160 latches the column address CA<0:n>, the column access system 100 does not require the external address ExtAdd<0:n> to be latched. Thus, the column counter 120 initiates counting to produce the column address CA<0:n> as soon as the external address ExtAdd is supplied. As a result, the generation of the column address CA <0:n> for performing a memory operation in the next clock cycle may be completed on the negative edge of the clock CLK defining the previous clock cycle, in which the external address ExtAdd is provided. All subsequent addresses from the column counter will be generated from the falling edge of the previous falling clock CLK edge.

There, accordingly, has been described a system for providing column access to a DRAM array having a column counter for producing a column address in response to an external address. The column address is latched in an address decoder which decodes the column address to select a column in the DRAM. A command decoder generates a column decode enable signal supplied to the address decoder to control latching of the column address, and a write enable signal, together with data, supplied to a write driver. A data latch is provided in the write driver for latching data until an equalize control signal is activated. The latched data signal drives global input/output pair to provide data writing to the DRAM.

In this disclosure, there are shown and described only the preferred embodiments of the invention, but it is to be understood that the invention is capable of changes and modifications within the scope of the inventive concept as expressed therein.

What is claimed is:

1. A random access memory comprising:
   a column counter responsive to an external address for producing a column address;
   a command decoder responsive to an external command for producing at least one of a column decode enable signal and a write enable signal;
   an address decoder responsive to the column address and column decode enable signal for producing a decoded column address signal used to select a column line, the address decoder having a column address latch for latching the decoded column address signal to prevent the decoded column address signal from being modified when the column address changes; and
   a write driver supplied with an input data signal representing data to be written in a selected memory cell and responsive to the write enable signal, the write driver having a first data latch controlled by the write enable signal for latching the input data signal and a second data latch coupled to said first data latch for latching a first data signal supplied from said first data latch.

2. A random access memory comprising:
   a column counter responsive to an external address for producing a column address;
   a command decoder responsive to an external command for producing at least one of a column decode enable signal and a write enable signal;
   an address decoder responsive to the column address and column decode enable signal for producing a decoded column address signal used to select a column line, the address decoder having a column address latch for latching the decoded column address signal to prevent the decoded column address signal from being modified when the column address changes;

a write driver supplied with an input data signal representing data to be written in a selected memory cell and responsive to the write enable signal, the write driver having a first data latch controlled by the write enable signal for latching the input data signal and a second data latch coupled to the first data latch for latching a first data signal supplied from the first data latch; and a gate circuit arranged between the first and second data latches for passing the first data signal to the second data latch when the write enable signal is in a first state, and for preventing the data signal from being supplied to the second data latch when the write enable signal is in a second state.

3. The memory of claim 2, wherein said second data latch is responsive to said first data signal to produce a second data signal for driving a data output circuit of said write driver.

4. The memory of claim 3, wherein said second data latch is cleared when an equalize control signal supplied from said command decoder goes to an active state.

5. A random access memory comprising:

a column counter responsive to an external address for producing a column address;

a command decoder responsive to an external command for producing at least one of a column decode enable signal and a write enable signal;

an address decoder responsive to the column address and column decode enable signal for producing a decoded column address signal used to select a column line, the address decoder having a column address latch for latching the decoded column address signal to prevent the decoded column address signal from being modified when the column address changes; and a write driver supplied with an input data signal representing data to be written in a selected memory cell and responsive to the write enable signal, the write driver having a write enable latch suppled with said write enable signal for producing a local write enable signal maintained at a first level until an equalize control signal supplied from said command decoder goes to an active state.

6. The memory of claim 5, wherein said write driver further comprises a data latch controlled by said local write enable signal for latching said input data signal.

7. The memory of claim 6, wherein said write driver further comprises a data output circuit driven by a data signal produced by said data latch.

8. The memory of claim 1, wherein said address decoder further comprises a second gate circuit controlled by said column decode enable signal for passing said decoded column address signal to said column address latch when said column enable signal is in an active state.

9. The memory of claim 8, wherein said column address latch is cleared when an equalize control signal goes to an active state.

10. A system for providing access to a column of a random access memory comprising:

a column counter responsive to an external address for producing a column address in a clock cycle, in which the external address is supplied;

an address decoder responsive to the column address for producing a decoded column address signal and having a column address latch for latching the decoded column address signal until an equalize control signal becomes active;

a command decoder responsive to an external command for producing a write enable signal and the equalize control signal; and a write driver responsive to an input data signal and the write enable signal for providing data writing to the random access memory, the write driver having a data latch for latching the input data signal until the equalize control signal becomes active and a write enable latch supplied with said write enable signal for producing a local write enable signal maintained at a first level until said equalize control signal becomes active.

11. A method of providing access to a column of a random access memory comprising the steps of:

in response to an external address generating a column address in a clock cycle, in which said external address is supplied;

decoding step column address to produce a decoded column address signal;

latching the decoded column address until an equalize control signal becomes active;

latching an input data signal representing data to be written in a selected memory cell until the equalize control signal becomes active; and latching a write enable signal for producing a local write enable signal maintained at a first level until said equalize control signal becomes active.

* * * * *